(12) United States Patent
Yoshie

(10) Patent No.: US 6,351,164 B1
(45) Date of Patent: Feb. 26, 2002

(54) PLL CIRCUIT

(75) Inventor: Kazuaki Yoshie, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/532,287

(22) Filed: Mar. 23, 2000

(30) Foreign Application Priority Data

Mar. 26, 1999 (JP) .......................................... 11-083778

(51) Int. Cl.⁷ ................................................. H03B 5/24
(52) U.S. Cl. .......................... 327/156; 327/147; 331/11
(58) Field of Search .................................. 327/156, 158, 327/159, 141, 157; 331/11, 17

(56) References Cited

U.S. PATENT DOCUMENTS

| 5,381,116 A | | 1/1995 | Nuckolls et al. ............. 331/1 A |
| 5,525,935 A | * | 6/1996 | Joo et al. ..................... 327/156 |
| 5,572,558 A | | 11/1996 | Beherns ....................... 375/376 |
| 5,646,968 A | * | 7/1997 | Kovacs et al. .............. 327/158 |
| 5,818,304 A | * | 10/1998 | Hogeboom .................. 327/147 |
| 6,031,428 A | * | 2/2000 | Hill ............................. 327/156 |

FOREIGN PATENT DOCUMENTS

| EP | 0 402 113 | 12/1990 |
| EP | 0 590 323 | 4/1994 |
| WO | 96 17435 | 6/1996 |

* cited by examiner

*Primary Examiner*—Dinh T. Le
(74) *Attorney, Agent, or Firm*—Hoagn & Hartson, L.L.P.

(57) ABSTRACT

An oscillating signal of a VCO (7), after being divided by a divider (2), is input by a phase comparator (3). The phase difference between the divider (2) and a reference signal is detected by the phase comparator (3), and phase error is smoothed by a loop filter (4) to yield a phase error signal. The oscillating signal of the VCO 7 is also input by a frequency detector (9) and is detected to determine whether it is equal to a predetermined value or in a predetermined range. On the basis of this detection result, a frequency error signal is output. The frequency error signal and the phase error signal, after being added together, are input by the VCO (7) as a control signal so that the oscillation frequency is controlled.

10 Claims, 3 Drawing Sheets

PLL CIRCUIT

BACKGROUND OF THE INVENTION

1. Field of the Invention

The present invention relates to a PLL circuit used as a circuit for regenerating a clock synchronized to a digital signal, such as a baseband signal for digital television.

2. Description of the Related Art

New techniques for transmission and reception with digital data have been developed in recent years for wireless broadcasting, such as for television and radio, and digital television broadcasting via satellites, and in some parts of the country, ground wave digital television broadcasting have been put to practical use. When demodulating the digital data for digital television, it is necessary to perform the demodulation according to a clock that is synchronized to the digital data. Thus, a clock regeneration circuit for regenerating the clock included in the digital data is provided in the digital demodulation circuit. In general, this clock regeneration circuit is configured as a PLL circuit, which uses digital data as a reference signal, as shown in FIG. 3. Demodulating with a regenerated clock is not limited to digital television signals and is applicable to digital demodulation in general.

First, in FIG. 3, a VCXO (voltage-controlled crystal scillator) 1, in which an oscillation frequency is controlled on the basis of a control voltage, generates an scillating signal, and the oscillating signal is divided by a divider 2. Thereafter, a phase comparator 3 detects a phase difference between the reference signal and the divided output of the VCXO 1 and outputs a digital signal in accordance with the phase difference. The output data of the phase comparator 3 is smoothed by a loop filter 4, then fed to a PWM (pulse width modulation) circuit 5.

The PWM circuit 5 generates a PWM pulse in accordance with the output data of the loop filter 4. The PWM circuit 5 outputs a pulse having a "H" or "L" level ratio on the basis of the output data of the loop filter 4. The PWM pulse, which has a fixed frequency, has a ratio of the "H" level width and "L" level width, namely, the duty ratio, that changes in accordance with the input data. For example, if the output data of the loop filter 4 is large, the "H" level width of the PWM pulse widens and the duty ratio increases. Conversely, if the output data of the loop filter 4 is small, the "H" level width of the PWM pulse widens and the duty ratio decreases.

The PWM pulse is fed to a LPF (low-pass filter) 6, and the LPF 6 performs digital to analog conversion by removing the high-frequency components and smoothing the PWM pulse. When the duty ratio of the PWM pulse is high, the output level of the LPF 6 rises, and when the duty ratio of the PWM pulse is low, the output level of the LPF 6 lowers. The output signal of the LPF 6 is supplied to the VCXO 1, and he oscillation frequency of the VCXO 1 is controlled in accordance with the output signal of the LPF 6.

In the circuit of FIG. 3, the VCXO 1 is controlled on the basis of a phase error between the reference signal and the output of the VCXO 1 at the phase comparator 3. Thus, the PLL circuit is controlled so that the oscillation frequency of the VCXO 1 substantially matches the frequency of the reference signal.

Since the oscillation frequency is set at a high precision, the VCXO is used for the oscillator in the PLL circuit of FIG. 3. Since the VCXO requires a crystal oscillating element or a varicap diode, it was not desirable to integrate the circuit of FIG. 3. Furthermore, in satellite digital television, for example, since the transmission speed of the baseband differs according to country or region, it was necessary to change the oscillating element for every destination for the VXCO, for which the variable frequency range is narrow.

To solve the aforementioned shortcomings, it is possible to use a VCO (voltage-controlled oscillator) having a wide variable frequency range and to have this single VCO adapt to all destinations. However, the lockup time of the PLL increases since the variable frequency range of the VCO is wide, and the oscillation frequency of the VCO itself deviates due to variations in the manufacturing process, resulting in a problem where lockup of the PLL becomes impossible.

SUMMARY OF THE INVENTION

According to the present invention, an error of an oscillation frequency is detected, and the oscillation frequency is adjusted in accordance with the detected error. As a result, when the oscillation frequency is large, this permits rapid adjustments compared to adjustments based on phase differences.

Furthermore, by controlling the oscillation of a voltage-controlled oscillator through the addition of a signal based on phase error and a signal based on frequency error, both control systems can be easily combined. Additionally, an appropriate control can be performed by adjusting the weight of these control systems.

DETAILED DESCRIPTION OF THE PREFERRED EMBODIMENTS

Figure 1:
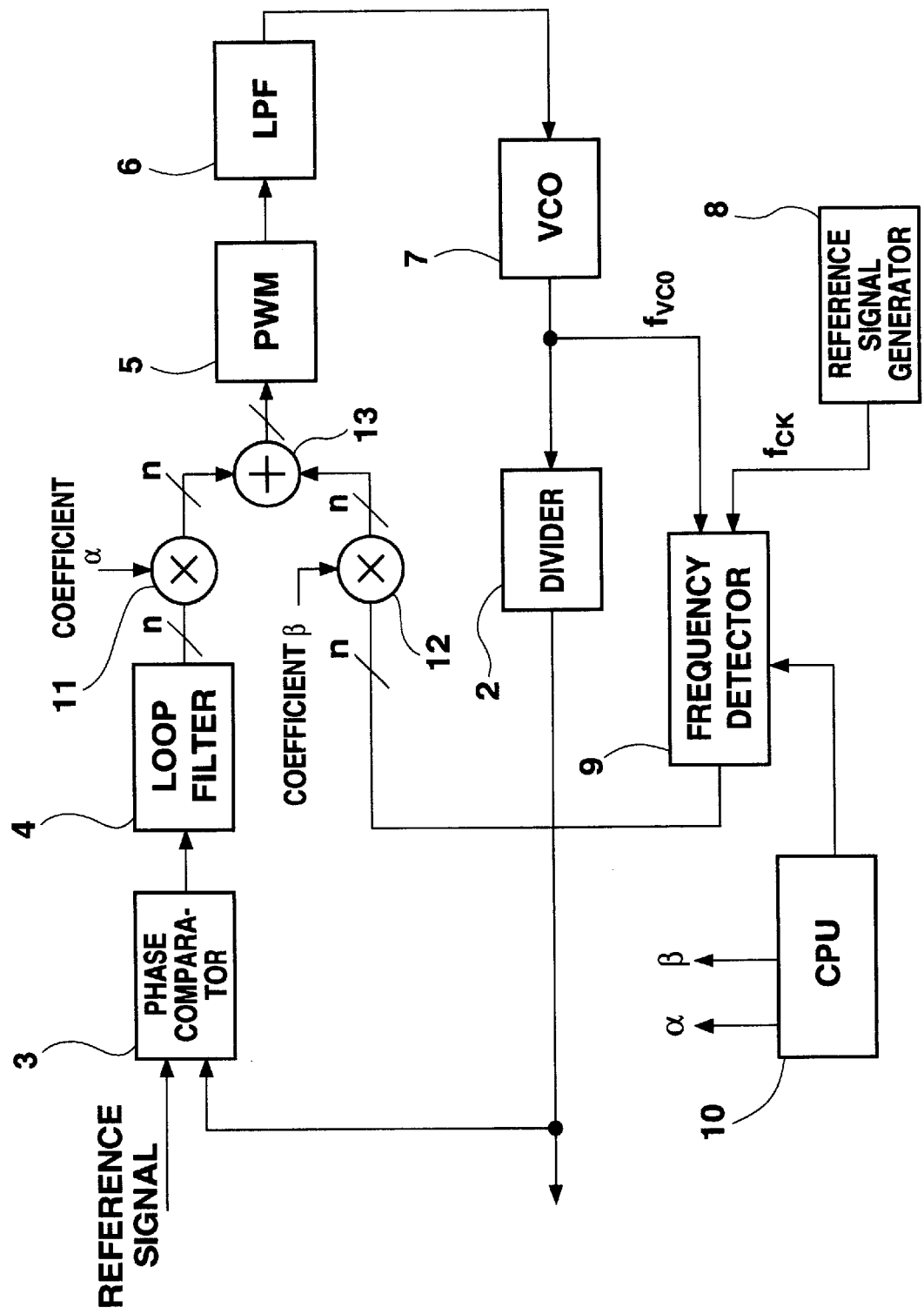
FIG. 1 is a block diagram showing an embodiment of the present invention.
Figure 3:
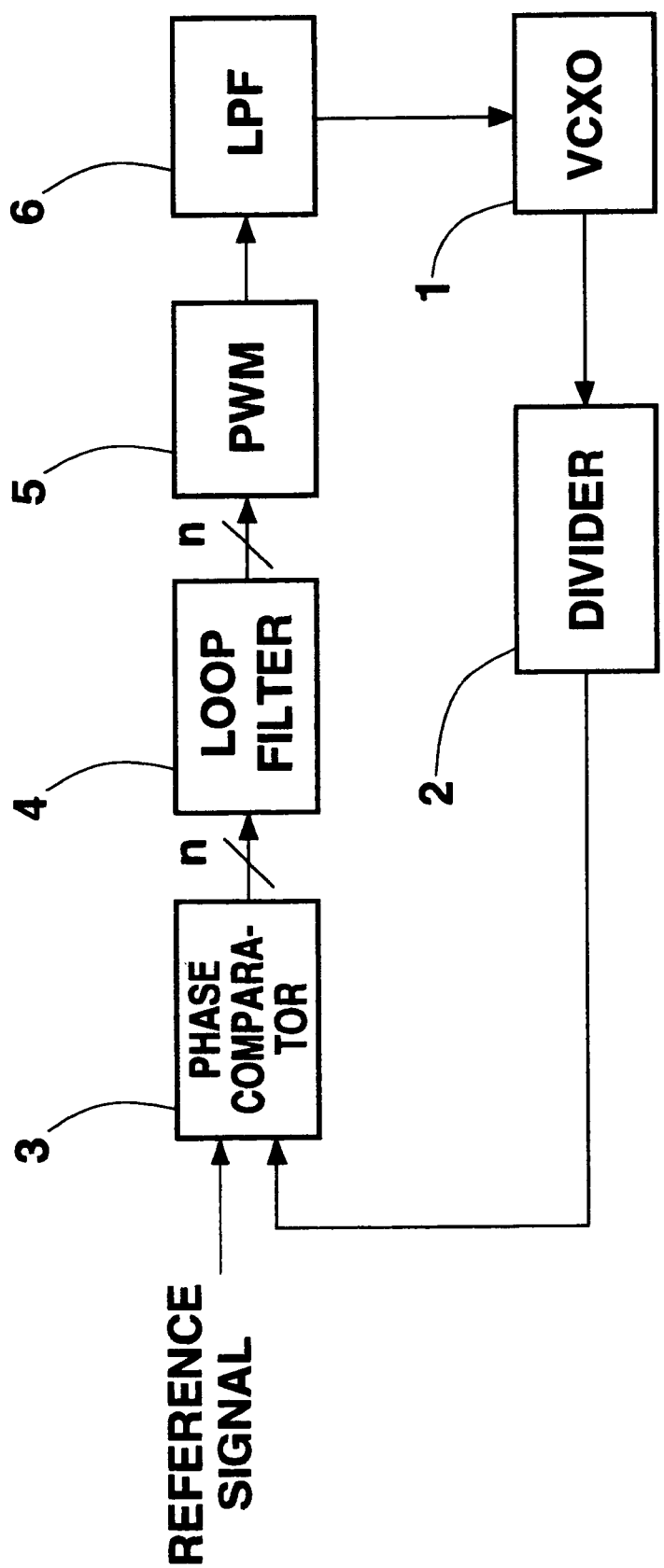
FIG. 3 is a block diagram showing a conventional example.

FIG. 1 shows an embodiment of the present invention comprising a VCO 7 for controlling an oscillation frequency on the basis of a control signal, a reference signal generator 8 for generating a reference signal of a fixed frequency, a frequency detector 9 for detecting the error of the oscillation frequency of the VCO 7 with a desired frequency on the basis of the reference signal and an oscillating signal of the VCO 7, a CPU 10 for outputting coefficients α and β and a frequency to be a target when an error frequency is detected by the frequency detector 9, a first multiplier 11 for attenuating the output data of the loop filter 4 in accordance with coefficient α, a second multiplier 12 for attenuating the output data of the frequency detector 9 in accordance with coefficient β, and an adder 13 for adding together the output data of the first and second multipliers 11 and 12. Circuits in FIG. 1 that are identical with those of the conventional example in FIG. 3 have the same reference numerals and their explanations are omitted.

The PLL circuit of FIG. 1 comprises a phase loop via the phase comparator 3 and a frequency loop via the frequency detector 9. The output data of the loop filter 4, which is a phase error signal of the phase loop, and the output data of the frequency detector 9, which is a frequency error signal of the frequency loop, are added together by the adder 13. The output data of the adder 13 is applied to the PWM circuit 5, and a PWM pulse that has been set with a duty ratio in accordance with the magnitude of the output data is output. The PWM pulse is converted to an analog control signal at the LPF 6 and the oscillation frequency of VCO 7 is adjusted in accordance with the control signal.

The oscillating signal of the VCO 7, after being divided by the divider 2, is input by the phase comparator 3. The phase difference between the divider 2 and the reference signal is detected at the phase comparator 3, and the phase error is smoothed by the loop filter 4 to yield the phase error signal. Thus, in the phase loop, the oscillation frequency of the VCO 7 is controlled so that the phase of the oscillating signal of the VCO 7 matches that of the reference signal.

The oscillating signal of the VCO 7 is also input by the frequency detector 9. At the frequency detector 9, the oscillation frequency of the VCO 7 is measured using the reference signal of the reference signal generator 8 as reference, and it is determined whether the measured oscillation frequency is at a predetermined value or in a predetermined range set by the CPU 10. If the measured oscillation frequency is not at the predetermined value or in the predetermined range, digital data is output from the frequency detector 9 to control the VCO 7 so that the oscillation frequency of the VCO 7 is at the predetermined value or in the predetermined range. As the frequency error signal, the digital data is updated until the oscillation frequency of the VCO 7 is at the predetermined value or in the predetermined range. Thereafter, when the oscillation frequency of the VCO 7 is at the predetermined value or in the predetermined range, the frequency detector 9 sets the digital data at that time to a fixed value. Thus, in the frequency loop, the VCO 7 is controlled so that the oscillation frequency of the VCO 7 is at the predetermined value or in the predetermined range.

As described above, the oscillation frequency of the VCO 7 is finely adjusted in the phase loop, and the oscillation frequency of the VCO 7 is coarsely adjusted in the frequency loop. Since the oscillation frequency of the VCO 7 is coarsely adjusted in the frequency loop, it is possible for the PLL to lock up in a short time. Furthermore, since the frequency error signal is fixed when the oscillation frequency of the VCO 7 is at the predetermined value or in the predetermined range, the PLL thereafter is controlled in the phase loop to enable stable lockup of the PLL to be achieved as well as jitter to be reduced.

Attenuating the error signals for the phase loop and frequency loop to appropriate levels at the first and second multipliers 11 and 12 enables the PLL to be set to desired characteristics. Furthermore, coefficient $\alpha$ and $\beta$ are set by the CPU 10 so it is possible to easily modify the characteristics of the PLL.

For example, if $\alpha$ is increased, the coarse adjustment based on the frequency loop quickens, and if $\beta$ is increased, the fine adjustment based on the phase loop quickens. Furthermore, it is possible to increase $\alpha$ when the frequency error is greater than or equal to the predetermined value, and to increase $\beta$ when the error falls within the predetermined range. For example, it is preferable to have $\alpha+\beta=1$, $\alpha \leq 1$, and $\beta \leq 1$. Furthermore, it is possible to set $\alpha=0$ and $\beta=1$ when the frequency error is greater than or equal to the predetermined value, and to set $\alpha=1$ and $\beta=0$ when the error is within the predetermined range.

Figure 2:
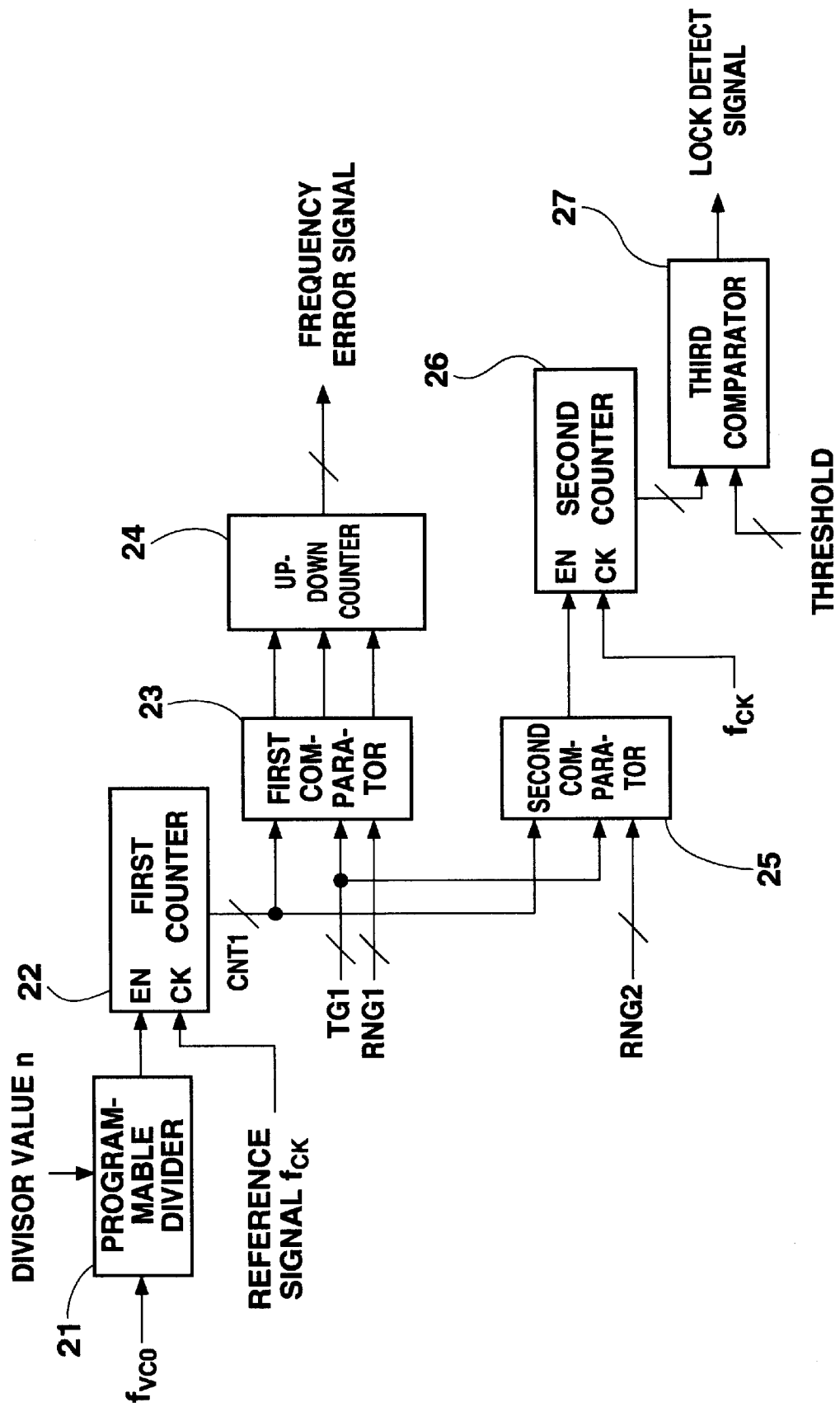
FIG. 2 is a block diagram showing an actual example of the frequency detector 9 of FIG. 1.

FIG. 2 shows an actual example of the frequency detector 9 of FIG. 1 comprising a programmable divider 21 for dividing an oscillation frequency fvco of the VCO 7 in accordance with a divisor value n that is set by the CPU 10, and a first counter 22, which has an enable terminal for inputting the output of the programmable divider 21, for counting an enable period reference signal fck as a clock. When the oscillation frequency fvco is high, the enable period shortens and a count value CNT1 of the first counter 22 decreases. Conversely, when the oscillation frequency fvco is low, the count value CNT1 increases. Thus, the oscillation frequency fvco can be determined to be high or low by the count value CNT1.

A first comparator 23 compares the count value CNT1 of the first counter 22 with a predetermined range, which is determined from a target value TGT and a frequency range RNG1 that are input from the CPU 10, with the lower limit set to TGT−RNG1 and the upper limit set to TGT+RNG1. An up-down counter 24 counts up or down in accordance with the comparison result of the first comparator 23 and outputs the count value as the frequency error signal. The up-down counter 24 counts down when the count value CNT1 is greater than the upper limit, counts up when the count value CNT1 is less than the lower limit, and maintains the count value when the count value CNT1 is within the range from the lower limit to the upper limit.

Therefore, when the oscillation frequency fvco is high, the frequency error signal is updated in an increasing direction and the oscillation frequency fvco of the VCO 7 is controlled in a lowering direction, and when the oscillation frequency fvco is low, the frequency error signal is updated in a decreasing direction and the oscillation frequency fvco of the VCO 7 is controlled in a rising direction. When the oscillation frequency fvco enters the predetermined range, the frequency error signal is fixed, thereby completing the frequency control in the frequency loop of the PLL circuit of FIG. 1.

In FIG. 2, the frequency range RNG1 can be set arbitrarily. Setting the frequency range RNG1 to a small range enables the oscillation frequency of the VCO 7 to converge in a narrow range through the frequency loop. This makes it possible to shorten the lockup time of the PLL. Furthermore, even if the oscillation frequency of the VCO 7 fluctuates due to fluctuations in supply voltage or temperature or to aging, the oscillation frequency of the VCO 7 can be corrected by the frequency detector 9.

The count value CNT1 of the first counter 22 is equivalent to the number of reference signals fck per period 1/(fvco/n) and equal to the ratio of the number of reference signals per second. This relationship is shown in the following formula.

Formula 1

$$CNT1:1/(fvco/n) \cong fck:1 \sec\ fvco/n \cong fck/CNT1 \qquad (1)$$

Furthermore, formula 1 is rewritten to solve for the count value CNT1 as shown next.

Formula 2

$$CNT1 \cong fck \cdot n/fvco \qquad (2)$$

If the divisor value n and the frequency of the reference signal are fixed at certain values, the count value CNT1 is obtained for the case where a desired oscillation frequency fvco is to be obtained. The target TNT and the frequency range RNG1 are set on the basis of the count value CNT1.

Formula 1 can be rewritten to solve for the oscillation frequency fvco as shown next.

$$fvco \cong fck \cdot n/CNT1 \qquad (3)$$

Since the target value TGT is set on the basis of the count value CNT1 as described above, the oscillation frequency fvco can be arbitrarily set by changing the reference signal frequency fck, target value TGT, and divisor value n. Thus, it is possible to use an ordinary VCO. Furthermore, even if the reference frequency fck is fixed, the oscillation frequency fvco can be changed arbitrarily by the divisor value n and the target value TGT, thereby allowing an ordinary oscillating element to be used in the reference signal generator 8 of FIG. 1 and an oscillating element that is used in another block to be used for this circuit.

FIG. 2 shows a circuit for detecting the locked state of the PLL circuit of FIG. 1. The PLL of FIG. 1 is not necessarily in a locked state even if the oscillation frequency of the VCO 7 is controlled by the frequency loop. The locked state is detected by utilizing the fact that the oscillation frequency of the VCO 7 is in an extremely narrow range for at least a predetermined time when the PLL locks.

In FIG. 2, a second comparator 25 compares the count value CNT1 of the first counter 22 with a predetermined range, which is determined from a target value TGT and a frequency range RNG2 that are input from the CPU 10, with the lower limit set to TGT−RNG2 and the upper limit set to TGT+RNG2. When the count value CNT1 enters the range of TGT±RNG2, an enable signal is output from the second comparator 25. A second counter 26 counts the period reference signal fck for the enable signal of the second comparator 25, and a third comparator 27 outputs a lock detect signal when the count value CNT2 of the second counter 26 is greater than or equal to a threshold. The above-mentioned circuit can detect whether the oscillation frequency of the VCO 7 is in an extremely narrow range for at least a predetermined time.

It should be noted that the first and second counters 22 and 26 are automatically reset when input of the enable signal during counting is interrupted.

According to the present embodiment, the phase loop and the frequency loop are provided, and the oscillation frequency of the vco is finely adjusted in the phase loop, and the oscillation frequency of the VCO is coarsely adjusted in the frequency loop. Thus, it becomes possible to lock up the PLL in a short time and in a stable manner.

While there has been described what is at present considered to be the preferred embodiment of the invention, it will be understood that various modifications may be made thereto, and it is intended that the appended claims cover all such modifications as fall within the true spirit and scope of the invention.

What is claimed is:

1. A PLL circuit for obtaining the oscillation frequency signal that is synchronized with an input signal, comprising:
    a voltage-controlled oscillator for oscillating at an oscillation frequency in accordance with a control signal;
    a phase difference detector for detecting a phase difference between the input signal and an output signal from the voltage-controlled oscillator;
    a loop filter for outputting said control signal based on an output signal of the phase difference detector;
    a frequency error detector for detecting error of the oscillation frequency by comparing the output signal of said voltage-controlled oscillator with a reference signal;
    an adder for adding said frequency error to said control signal; and
    a first multiplier for multiplying the control signal from said loop filter with a first coefficient and a second multiplier for multiplying the output signal of said frequency detector with a second coefficient, wherein an output of the first multiplier and an output of the second multiplier are added by said adder, and
    said control signal is adjusted in accordance with the error of the frequency detected by said frequency error detector and supplied to said voltage-controlled oscillator.

2. A PLL circuit for obtaining the oscillation frequency signal that is synchronized with an input signal, comprising:
    a voltage-controlled oscillator for oscillating at an oscillation frequency in accordance with a control signal;
    a phase difference detector for detecting a phase difference between the input signal and an output signal from the voltage-controlled oscillator;
    a loop filter for outputting said control signal based on an output signal of the phase difference detector; and
    a frequency error detector for detecting error of the oscillation frequency by comparing the output signal of said voltage-controlled oscillator with a reference signal, said frequency error detector comprising:
    a counter for counting the frequency of the output signal of said voltage-controlled oscillator;
    a comparator for detecting whether a count value of the counter is within a predetermined range; and
    a lock detection circuit for detecting a locked state of the PLL circuit, wherein
    said control signal is adjusted in accordance with the error of the frequency detected by said frequency error detector and supplied to said voltage-controlled oscillator.

3. A PLL circuit according to claim 2 further comprising an adder for adding said frequency error to said control signal.

4. A PLL circuit according to claim 3, comprising:
    a first multiplier for multiplying the control signal from said loop filter with a first coefficient and a second multiplier for multiplying the output signal of said frequency detector with a second coefficient, wherein an output of the first multiplier and an output of the second multiplier are added by said adder.

5. A PLL circuit for obtaining the oscillation frequency signal that is synchronized with an input signal, comprising:
    a voltage-controlled oscillator for oscillating at an oscillation frequency in accordance with a control signal;
    a phase difference detector for detecting a phase difference between the input signal and an output signal from the voltage-controlled oscillator;
    a loop filter for outputting said control signal based on an output signal of the phase difference detector; and
    a frequency error detector for detecting error of the oscillation frequency by comparing the output signal of said voltage-controlled oscillator with a reference signal, said frequency error detector comprising:
    a first counter for counting the frequency of the output signal of the voltage-controlled oscillator; and
    a first comparator for comparing a count value of the first counter with a first predetermined set value, wherein
    a frequency error signal is output in accordance with a comparison result of the first comparator, and
    said control signal is adjusted in accordance with the error of the frequency detected by said frequency error detector and supplied to said voltage-controlled oscillator.

6. A PLL circuit according to claim 5, wherein
    said first comparator of said frequency error detector judges whether the count value of the first counter is in a first predetermined range determined by said first set value;

a count-up signal is output when said count value is larger than said first predetermined range, and a count-down signal is output when said count value is smaller than said first predetermined range; and an up-down counter counts the count-up signal or the count-down signal, and, the up-down counter outputs said frequency error signal.

7. A PLL circuit according to claim 6, further comprising:

a second counter for counting the frequency of the output signal of said voltage-controlled oscillator;

a second comparator for detecting whether the count value of the first counter is in a second predetermined range; and a lock detection circuit for detecting a locked state of the PLL circuit based on a count result of the second counter.

8. A PLL circuit according to claim 5, further comprising an adder for adding said frequency error to said control signal.

9. A PLL circuit according to claim 8, comprising:

a first multiplier for multiplying the control signal from said loop filter with a first coefficient and a second multiplier for multiplying the output signal of said frequency detector with a second coefficient, wherein an output of the first multiplier and an output of the second multiplier are added by said adder.

10. A PLL circuit according to claim 9, further comprising:

a second counter for counting the frequency of the output signal of said voltage-controlled oscillator;

a second comparator for detecting whether the count value of the first counter is in a second predetermined range; and a lock detection circuit for detecting a locked state of the PLL circuit based on a count result of the second counter.

* * * * *